Dec. 22, 1964 L. PENSAK 3,162,589

METHODS OF MAKING SEMICONDUCTOR DEVICES

Filed June 1, 1954 2 Sheets-Sheet 1

INVENTOR.
LOUIS PENSAK

BY J. C. Whittaker
ATTORNEY

INVENTOR.
LOUIS PENSAK
BY J. C. Whittaker
ATTORNEY

United States Patent Office 3,162,589
Patented Dec. 22, 1964

3,162,589
METHODS OF MAKING SEMICONDUCTOR DEVICES

Louis Pensak, Princeton, N.J., assignor to Radio Corporation of America, a corporation of Delaware Filed June 1, 1954, Ser. No. 433,495
13 Claims. (Cl. 204—143)

This invention relates to improved semi-conductor devices and methods of making them. More particularly it relates to a method of making a semi-conductor device having two rectifying barriers uniformly and accurately spaced apart.

Semi-conductor devices useful for amplifying signals in electrical circuits are known as transistors and, in general, comprise a semi-conductor body having at least two rectifying barriers associated with it. To provide uniform and reproducible results it is generally desirable accurately to control the thickness of the base region, i.e., the spacing between the rectifying barriers, in these devices because their operation depends to a large extent upon the thickness of the base region and the uniformity of the spacing between the barriers. The significant charge carriers of a typical transistor are injected into the semi-conductor body at one barrier (the emitter) and collected at another (the collector). The charge carriers move from one barrier to the other primarily by diffusion, and the elapsed time between their injection and their collection, called the transit time, strongly affects the characteristics of the device. Especially in transistors designed to operate at relatively high frequencies it is important that the transit time of the charge carriers be substantially independent of the portion of the emitter from which they are injected. That is, to minimize signal distortion all the carriers injected by the emitter at a given instant of time should arrive at the collector simultaneously. To minimize differences in transit time between carriers injected at one portion of the emitter and those injected at other portions it is desirable to align the emitter and collector barriers substantially parallel to each other. It is also desirable to place the two barriers as close together as possible in order to minimize the average transit time and to minimize transit time dispersion, a phenomenon that "spreads" an impressed signal and limits the high frequency response of transistors.

One type of transistor is the point-contact transistor which generally comprises two sharply pointed, rectifying probes pressed lightly upon the suface of a semi-conductor body at closely adjacent points. One difficulty in making point contact transistors is placing the probes sufficiently close together. Required uniform spacings of less than .001" have been found extremely difficult to provide.

In devices having relatively large area barriers, on the other hand, close spacing appears to be somewhat less of a problem since the barriers may be formed by alloying electrodes into opposite surfaces of thin wafers. Making two closely spaced large area barrier surfaces substantially parallel, however, has been found relatively difficult.

One method of making a large area barrier is the surface alloy method in which an impurity material is alloyed into a semi-conductor body. Transistors are made by the alloy method by alloying impurity-yielding materials into two opposite surfaces of a semi-conductor wafer. The depth of penetration of the impurity material is dependent upon the metallurgical properties of the impurity material and of the semi-conductor, and may be controlled by the temperature at which alloying is carried out. Non-uniformity of the wetting of the semi-conductor by the impurity material over the entire area of contact may, however, affect the shape of the barrier produced. Relatively slight crystallographic imperfections of the base wafer may also affect the shape of the barrier.

Another method of providing a large area barrier transistor is described in an article by Tiley and Williams in The Proceedings of the I.R.E., volume 41, page 1706, December 15, 1953. This method comprises electroetching pits into opposite sides of a wafer of n-type germanium by means of a jet and electroplating a metal upon the etched surfaces. Devices produced by this method not only may vary somewhat one from another in the spacing between their rectifying barriers, but also may have barriers that are not essentially parallel over most of their effective areas.

Accordingly, one object of the present invention is to provide an improved, generally applicable method of establishing a predetermined spacing between barriers of multi-electrode semi-conductor devices.

Another object is to provide improved semi-conductor devices comprising accurately, uniformly and closely-spaced barriers.

Another object is to provide an improved method of controllably etching a semi-conductive material.

Another object is to provide improved methods of and apparatus for determining the thickness of a selected portion of a semi-conductor body.

Still another object is to provide an improved method of controllably electroplating a material upon a preselected portion of a surface of a semi-conductor body.

A still further object is to provide improved apparatus for making semi-conductor devices.

These and other objects are accomplished by the instant invention according to which an electroetching procedure is utilized to control the thickness of a region adjacent to a barrier in a semi-conductor body. Briefly, one rectifying barrier is established by any known means in a semi-conductor body. A surface of the body opposite and roughly parallel to the barrier is electrolytically etched to reduce the thickness of the semi-conductive material adjacent to the barrier. An alternating potential applied across the barrier is utilized to measure the extent of the etching. A second barrier may then be established at the etched surface to form a transistor. The thickness of the critical portion of the semi-conductor body, i.e., the base region, may be accurately controlled from about 1$\mu$ to 50$\mu$ by etching according to the invention, and the effective electrical thickness may be continuously measured during the process. The thickness of the base region is electrically substantially uniform throughout.

The invention will be described in greater detail in connection with the accompanying drawings of which:

Similar reference numerals are applied to similar elements throughout the drawings.

*Example 1*

Figure 1:
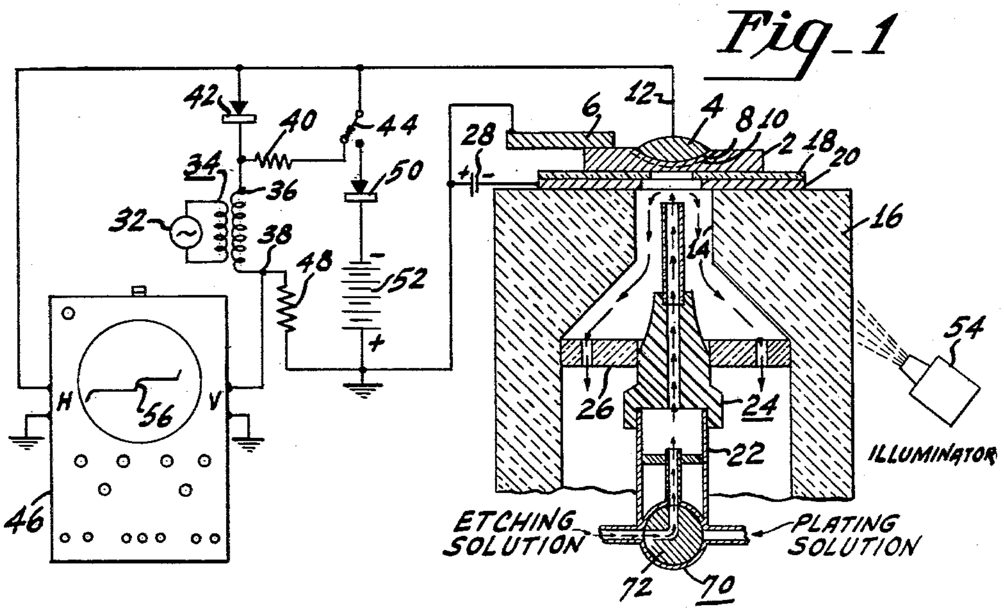
FIGURE 1 is a schematic, elevational, cross-sectional view of apparatus suitable for the practice of the invention.

According to one embodiment of the invention a transistor suitable for operation at relatively high frequencies may be produced by the apparatus illustrated in FIGURE 1. A single crystal wafer 2 of n-type semi-conductive germanium having a resistivity of about 1 ohm-cm. is prepared by etching in a bath comprising by volume 45% concentrated nitric acid, 45% concentrated hydro fluoric acid and 10% water. Before etching, the wafer may be of any convenient size such as about ¼" x ⅛" x .01" thick. It is etched to reduce its thickness to about .005" to .006" and to expose a fresh, crystallographically undisturbed surface. An electrode consisting of a disc of indium about .03" in diameter and about .005" thick is placed on one surface of the wafer. The wafer and disc are heated together in a dry hydrogen atmosphere at about 500° C. for about 10 minutes to alloy the disc to the wafer and to form a rectifying barrier 8 in the wafer. The device thus formed is etched in an acid solution for about 30 seconds to expose the peripheral portions of the barrier. The etchant may be generally similar to the solution initially utilized to clean the surface of the wafer.

The prepared device as shown in cross section in FIGURE 1 comprises the base wafer 2 and an indium electrode 4. A p-n rectifying junction 8 is disposed adjacent to the boundary surface between the electrode and the base wafer. The dotted line 10 schematically represents the edge of the depletion layer, which is explained in greater detail hereinafter. Electrical leads 12 and 6 are soldered to the indium electrode and to the wafer respectively and the device is placed over a masking aperture 14 in an insulating die 16. The die is provided with an insulating masking washer 18 and an electrode washer 20 having a larger aperture than the insulating washer. The apertures of both washers are aligned with each other to define an exposed area upon the surface of a semiconductor wafer. The insulating washer is disposed between the wafer and the electrode washer electrically to insulate the one from the other.

The die body is hollowed out to make room for an ejection apparatus such as the hypodermic tube 22 and nozzle 24 shown. The ejection apparatus is rigidly held in place by means of an insulating spider 26 through which ejected fluids may return to a collecting pan (not shown).

The wafer is placed over the aperture and the alloyed electrode is aligned with the masking aperture. An etching potential is applied between the wafer and the electrode washer. The etching potential may be conveniently supplied by a battery 28 and is preferably about 1 to 3 volts but may be varied according to the principles hereinafter described. The wafer is connected to a point of fixed potential, referred to herein as a ground, and the electrode washer is maintained at a negative potential with respect to ground.

The wafer and the alloyed electrode are connected to a control circuit as shown in FIGURE 1. This circuit measures the progress of the etching, accelerates the rate of etching during the initial stages and controls the etching so that when the etching penetrates the wafer to within a preselected distance of the barrier the penetration is stopped and etching is allowed to proceed only in lateral directions.

According to the embodiment of the invention shown in FIGURE 1 the circuit comprises a source 32 of alternating electric current connected to the input of a transformer 34. The source is not critical and may conveniently be an ordinary 110 volt, 60 cycle power source. The transformer voltage ratio is selected to provide a peak value of at least about 10 volts across the output winding. This voltage is not critical, but it must exceed the sum of the effective electrical thickness of the base region and the electrolyzing potential. In making a typical device the peak value may be about 30 to 75 volts. One of the output terminals 36 of the transformer is connected to a limiting resistor 40 and to the cathode of a rectifying circuit element 42 such as a crystal diode. The resistor may have a value of about 1000 ohms and may be selectively included or excluded from the circuit by a single-pole, double-throw switch 44. When the switch is in a first position the resistor is connected in parallel with the diode and allows passage of current in the direction opposite to that permitted by the diode. The contact arm of the switch is connected to the anode of the diode, to the alloyed electrode and to the input H of the horizontal deflection system of an oscilloscope 46. The oscilloscope is D.C. connected to display along its horizontal scale the instantaneous voltages between the alloyed electrode and ground. For the purposes of the invention the oscilloscope display may be centered by displacing the origin of the trace to show substantially only that portion of the voltage cycle which is applied in the back direction across the semi-conductor barrier.

The second output terminal 38 of the transformer is connected to the input V of the vertical deflection system of the oscilloscope and, through a sampling resistor 48 of about 1000 ohms, to ground. The vertical deflection of the oscilloscope indicates the voltage across the sampling resistor and thus indicates the current in the secondary winding of the transformer which is also the current through the electrode barrier. The oscilloscope, therefore, displays the current-vs.-voltage characteristic of the barrier.

The second contact point of the switch is connected to the anode of a rectifying element 50 such as a crystal diode. The cathode of the diode is connected to the negative terminal of a biasing battery 52 or other source of an adjustable electric potential. The positive terminal of the battery is connected to the common ground.

Etching according to the invention is affected by the intensity of the light that impinges upon the semi-conductor surface. The rate of etching is accelerated by an increase of light since impinging light creates electric charge carriers at the semi-conductor surface. This effect of light upon etching is utilized according to the invention to measure the thickness of the region between the barrier initially established in the wafer and the surface being etched. Satisfactory results are achieved by the use of a relatively intense ambient light field. It is preferred, however, in order to insure a relatively high degree of uniformity, to provide an auxiliary light source such as a microscope illuminator 54 directed upon the surface being etched. Because of the requirement for illumination, and in order to minimize constructional complications, it is preferred also to make the apertured die 16 of a transparent material such as glass or Lucite so that ample light may reach the etched surface.

In operation, an etchant such as a 2% aqueous solution of sodium hydroxide or a dilute hydrochloric acid solution is forced through the nozzle to impinge upon the surface of the wafer. The switch is thrown to its first position to connect the limiting resistor in parallel with the diode. The initial display shown on the oscilloscope is the common back current characteristic of a germanium diode rectifier, that is, as the back voltage applied across the alloyed electrode barrier is increased a relatively small amount of current is induced through the barrier. The current remains relatively constant as the voltage is increased up to the breakdown voltage where the current increases suddenly and rapidly.

As the etching proceeds, however, a step 56 appears in the characteristic as shown on the face of the oscilloscope in FIGURE 1. As the back voltage applied to the alloyed electrode is increased beyond a critical value the induced current increases by a relatively small amount, forming a step in the characteristic, at some voltage less than the breakdown voltage. The increased current then remains substantially constant until the breakdown voltage is reached. The instantaneous voltage at which the step occurs is the minimum effective electrical thickness of the region between the barrier and the surface being etched. This thickness decreases as the etching progresses. When the step occurs at a preselected voltage, which may be readily observed on the oscilloscope, the switch is thrown to its second position to disconnect the limiting resistor and to connect the biasing battery to the alloyed electrode. The battery is adjusted to provide a back voltage approximately equal to the preselected voltage plus the electrolyzing voltage. The etching is allowed to proceed further for a predetermined time in order to broaden the region in which the etched surface is parallel to the previously established barrier.

When the biasing potential is applied across the barrier the etching ceases to penetrate deeper into the wafer but still proceeds in lateral directions to broaden out the pit, or well, formed by the process. The extent of the broadening action may be readily controlled by stopping the etching at a predetermined time after applying the biasing voltage. Generally, a time of 1 to 3 minutes provides adequate broadening, although, for certain devices such as power transistors, where exceptionally large surfaces are desired a longer time may be utilized.

The etched device is removed from the die and rinsed. An electrode forming a second rectifying barrier may then be fixed upon the etched surface at the base of the pit. This electrode may conveniently be of indium or of any other metal that is capable of injecting positive charge carriers (holes) into the germanium. If this electrode is of indium it may be readily bonded to the germanium by first placing a drop of a flux such as a 25% aqueous solution of zinc chloride upon the surface, placing a body of indium upon the flux-wet surface and heating the device to about 200° C. for a few seconds. It is not necessary to provide a special atmosphere. This type of low temperature alloying may be carried out in air.

Figure 2:
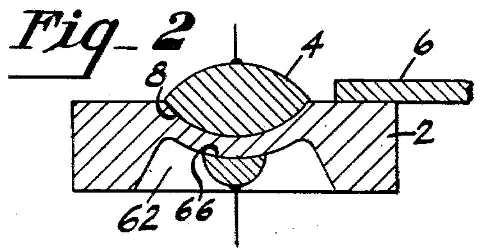
FIGURES 2 through 5 are schematic, elevational, cross-sectional views of various devices made according to the invention.

A typical transistor device produced by this method is shown in FIGURE 2. It comprises a base 2 of n-type semi-conductive germanium, a collector electrode 4 alloyed to the base, an etched pit 62 in the surface of the base opposite the collector and a second, emitter electrode 64 bonded to the surface of the base at the bottom of the etched pit. Rectifying barriers 8 and 66 are disposed in the base, one adjacent to each of the electrodes.

As explained heretofore, the effective electrical spacing between two rectifying barriers of a transistor is a critical factor. In the practice of the invention this spacing is made exceptionally uniform both with respect to different points along the barrier surfaces and with respect to different devices. In previous work, substantial effort has been expended to make the physical spacing between the two barriers uniform. It was hoped that if the physical uniformity were of a sufficiently high order, the electrical characteristics of the devices would also be uniform. In the practice of the instant invention, however, the electrical uniformity of the devices is controlled directly by measuring and controlling the electrical spacing between the two rectifying barriers. The dependence upon physical uniformity is effectively minimized since the physical spacing is automatically adjusted to compensate for physical non-uniformities. The effects of variations in the resistivities of different wafers are also minimized in the practice of the invention.

The presently accepted theory that appears best to explain the process of the invention may be outlined as follows:

When a biasing potential is applied between the rectifying electrode and the semi-conductor body of a device substantially all of the potential appears across a relatively small region which includes the barrier. This region has been called the Schottky barrier. It is also known as the depletion layer because it comprises an electric field which repels the majority charge carriers out of the region so that it may be said to be depleted of charge carriers.

In a loose sense the rectifying barrier may be regarded as synonymous with the depletion layer but more strictly the barrier is a theoretical surface disposed within the depletion layer. The thickness and the exact location of the depletion layer depend upon the resistivities of the materials of either side of the barrier and upon the applied potential. The thickness of the layer increases as the applied potential is increased up to the breakdown voltage.

In the practice of the invention after the wafer is etched to depth a biasing potential is applied across the barrier. This potential is adjusted to be approximately equal to the sum of the electrical thickness of the region and the electrolyzing potential. The biasing potential establishes a depletion layer having a thickness about equal to the electrical thickness, at its minimum point, of the region between the barrier and the etched surface. The biasing potential then counteracts the electrolyzing potential and electrolytic etching does not penetrate beyond the edge of the depletion layer. The electrolyzing potential must, of course, always be less than the biasing potential and is preferably of a relatively small magnitude such as four volts or less. When utilizing relatively large biasing potentials, however, correspondingly greater electrolyzing potentials are permissible. The biasing potential, in turn, is primarily limited by the breakdown voltage of the barrier. The effects of Joulean heating which tend to lower the breakdown voltage are minimized since heat is rapidly conducted away from the device by the electrolyte.

At the start of the etching procedure, and until the biasing potential is applied, the applied signal is utilized not only to measure the depth of etching but also to accelerate the rate of etching and to cause the etching to produce a relatively sharp pit with a minimum of undercutting and side etching. These effects are explained in greater detail hereinafter.

The electrical thickness of the depletion layer is measured during the negative portion of each cycle of the input signal. As the potential applied in the back direction across the barrier increases, the depletion layer becomes thicker and extends deeper into the wafer toward the etched surface. The electric charge carriers created by the light impinging on the etched surface are normally attracted into the electrolyte and form a part of the etching current. When the edge of the depletion layer approaches the etched surface, however, the depletion layer attracts the light-created charge carriers and accelerates them through the barrier so that they serve to increase the barrier current. A relatively sudden increase in current occurs, therefore, when the control signal reaches an instantaneous value that corresponds to the effective electrical thickness of the base region, i.e., when the depletion layer contacts the etched surface. As the potential is further increased the current remains substantially constant up to the breakdown voltage of the barrier.

The depletion layer, so far as is known, does not extend into the electrolyte beyond the wafer, but an electric field counteracting the etching potential is extended into the electrolyte as the potential across the barrier is increased beyond the effective electrical thickness of the base region. (When this electric field is sufficiently extended so that the field at the interface between the wafer and the electrolyte is substantially neutral the etching ceases.) As the negative portion of the input cycle wanes the current characteristic retraces the path already established. During that portion of the cycle in which the negative potential at the edge of the depletion layer equals or exceeds the electrolyzing potential, the penetration by the etching is stopped. During all other portions of the cycle the etching continues to penetrate through the wafer toward the barrier.

During the positive portion of the cycle of the control signal relatively large currents are induced across the barrier to augment the electrolyzing potential supplied by the battery and the measurement of the thickness of the base region is suspended. The magnitude of the etching current supplied by the signal is limited by the resistor in parallel with the crystal diode. The resistance of the barrier is relatively low with respect to current flow in the positive direction and it may be damaged if the current flow is not limited by an external circuit means.

The diode connected between the input transformer and the alloyed electrode prevents the flow of signal current in a positive direction through the electrode when the switch is in its second position. During the second phase of the process the biasing battery serves to maintain a minimum back potential across the barrier of the device as explained heretofore. If desired, the entire signal circuit may be disconnected during the second phase of the process. It is preferred, however, to continue to apply the signal voltage to monitor the operation as the etched pit is broadened. The signal voltage interrupts the etching during negative portions of its cycle only, and because of the rectifier element, does not affect the etching during the positive portions of its cycle. The rectifier element connected between the biasing battery and the switch serves to prevent current flow in a reverse direction through the biasing battery as may otherwise occur during the negative portions of the control signal.

It may be seen from the foregoing that an automatically terminating etching process is possible without the use of an alternating signal applied to the device being etched. For example, if the apparatus shown in FIGURE 1 is operated without the signal control voltage and the switch is maintained in its second position to apply the biasing potential across the barrier of the device being etched, a pit may be etched into the wafer to within a preselected electrical distance of the barrier. The depth of penetration of the etching and, therefore, the depth of the etched pit will be effectively controlled by the biasing potential. Substantial variations, however, may occur in the width of the pit, in undercutting and in side etching. These variations may depend upon many different variables such as the location of the initially formed barrier and the resistivity of the wafer.

According to the invention, on the other hand, the broadening of the etched pit may be controlled by etching for a predetermined time after the depth of penetration is established. This is possible because the invention provides a means of determining when the etching has penetrated to the edge of the depletion layer.

Side etching and undercutting are minimized in etching according to the invention also because during the positive half cycle of the applied control voltage charge carriers to augment the etching current are provided by the electrode. These charge carriers are injected by the electrode through the barrier into the wafer and exist in relatively high concentrations in the region adjacent to the base of the pit. Without the injection of such charge carriers the etching depends to a large extent upon the charge carriers created by impinging light. It is difficult to concentrate an intense light source at the base of the pit while keeping the remainder of the wafer in the dark. When etching without the applied control voltage, therefore, charge carriers are provided in greatest concentration about the periphery of the pit rather than at its base, thus producing undercutting and side etching. Sharply defined pits with a minimum of undercutting and side etching are desirable for making high frequency devices.

The use of a washer electrode in close proximity to the surface being etched permits the use of a relatively low electrolyzing potential. Electrolyzing at a low potential is desirable in order to insure accurate control of the depth of penetration by the depletion layer effect. Alternatively, the nozzle through which the etchant is fed may serve as an electrode. If the nozzle is of metal and is placed sufficiently close to the surface, a satisfactorily low voltage may be used. When using the metal electrode washer, however, the material of the nozzle and its spacing from the wafer are not critical.

In the control of the etching procedure as heretofore described, the signal voltage, as displayed on the oscilloscope, may be utilized to actuate a signalling device or to operate a relay automatically to throw the switch to its second position when the desired depth of penetration is reached.

Figures 6, 7, 8:
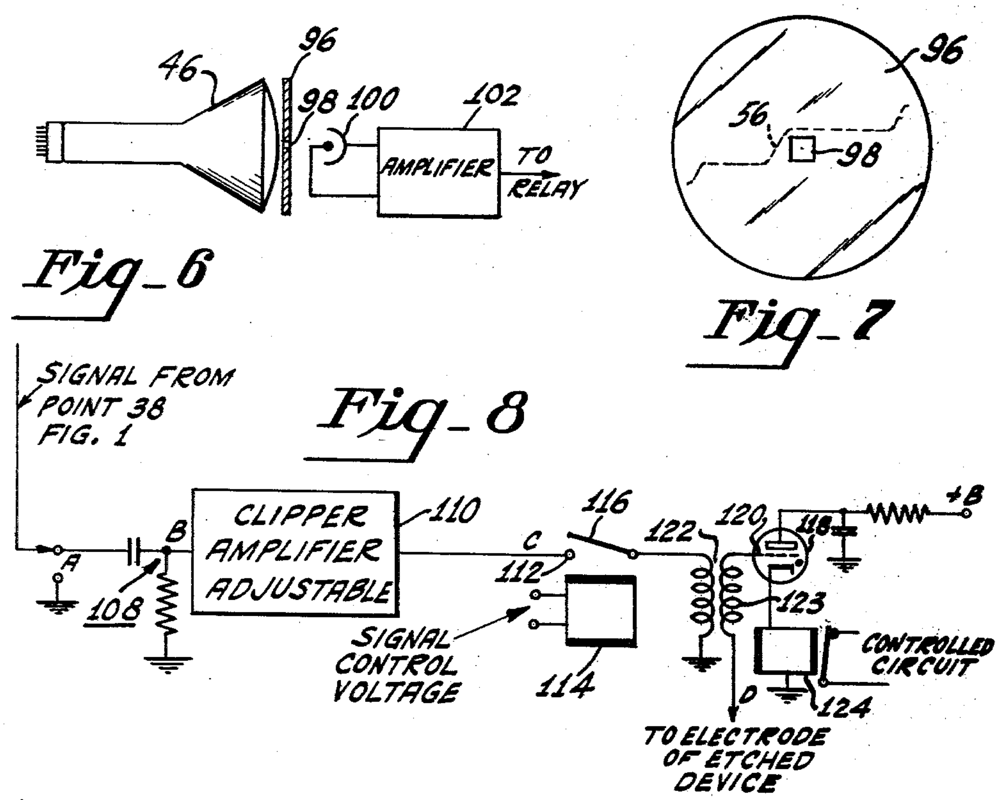
FIGURE 6 is a schematic, elevational, cross-sectional view of apparatus for providing automatic control of an etching process according to the invention.
FIGURE 7 is an elevational view of a part of the apparatus of FIGURE 6.
FIGURE 8 is a schematic, circuit diagram illustrating a second means for automatic control of an etching process according to the invention.

One method of utilizing the signal voltage displayed on the oscilloscope automatically to terminate the etching penetration is illustrated in FIGURES 6 and 7 wherein is shown a mask 96 defining an aperture 98. The mask is of any convenient shape and is adapted to cover all or a major portion of the face of the oscilloscope 46 on which the signal voltage is displayed. The mask is adjustable in position so that the aperture may be located at any desired site upon the face of the oscilloscope. A photosensitive device such as a photovoltaic selenium cell is placed adjacent to and facing the aperture and is connected to an amplifier. The amplifier is connected in a circuit to operate a relay when the photocell is energized by light projected through the aperture from the oscilloscope.

In operation the mask is positioned as shown in FIGURE 7 so that the upper edge of the aperture is below the normal position of the trace, i.e., during that portion of the signal voltage which occurs before the step light from the trace cannot penetrate the mask. The mask is positioned horizontally so that the left hand edge of the aperture is situated approximately at a point corresponding to the preselected voltage. As the etching proceeds the step in the trace progresses from left to right as shown in the drawing, and when the step occurs at the predetermined voltage the trace passes across an area of the oscilloscope face opposite the aperture. Light from this area then activates the photocell which by means of the amplifier 102 operates a relay 104 which may perform any desired function such as changing the position of the switch 44 of FIGURE 1.

A second means for securing automatic termination or control of the etching process comprises the electronic circuit shown in FIGURE 8. This circuit includes a differentiator input circuit 108 connected to a clipper amplifier 110. The amplifier is provided with any known means to adjust the amplitude of its output pulses. The output circuit of the amplifier is connected to one contact 112 of a vibrator 114 which is energized by the signal control voltage and synchronized to provide a closed circuit only during a selected portion of the negative half cycle of the signal control voltage. The contact arm 116 of the vibrator is connected through a transformer 122 to the grid 120 of a gas tube 118. The lower end of the output winding 123 of the transformer is connected to the electrode 4, FIGURE 1, of the device being etched. A relay 124 is included in the output circuit of the gas tube to provide a signal or to actuate any desired mechanism to control the etching process.

Figure 9:
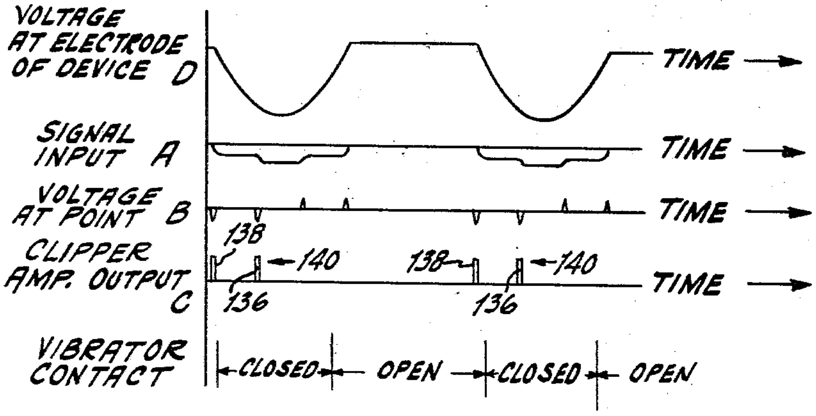
FIGURE 9 is a series of curves showing voltage waveforms that occur at points in the circuit of FIGURE 8.

The operation of the circuit may be understood by reference to the voltage curves shown in FIGURE 9 which illustrate the time relationships between the instantaneous voltages occurring at various points of the circuit during its operation. The circuit points at which the various voltages occur are identified by the reference letters A, B, C and D which correspond to like letters identifying the respective voltage curves. The electrode voltage D is applied through the transformer secondary winding to provide a varying negative bias in the grid of the gas tube which must be overcome by a signal from the clipper amplifier in order to trigger the gas tube. The signal voltage A as shown on the oscilloscope is fed through the differentiator to provide a series of pulses B at the input of the clipper amplifier. The amplifier is adjusted so that the difference between the amplitude of its output pulses C and the voltage at which it is desired to control the etching process is just equal to the voltage required to trigger the gas tube. The vibrator is adjusted to disconnect the output of the amplifier from the gas tube grid during portions of the control voltage cycle in which false pulses may be generated. In particular, the pulse 138 which is generated at the beginning of the negative half cycle of the alternating control voltage does not vary in time as a function of the progress of the etching. The vibrator, therefore, is adjusted to provide an open circuit during this pulse so that the pulse is not effective to trigger the gas tube.

As the etching proceeds the output pulses of the amplifier that are transmitted to the gas tube grid occur simultaneously with smaller and smaller values of the electrode voltage, i.e., the transmitted pulses are advanced in time with respect to the electrode voltage D as indicated by the arrow 140. When the etching has progressed to the desired extent a pulse 136 occurs when the instantaneous electrode voltage is equal to the predetermined voltage. The sum of the positive pulse voltage and the negative instantaneous electrode voltage is then sufficient to trigger the gas tube to actuate the relay 124.

Another feature of the invention relates to the accurate control of electroplating an electrode upon a selected surface of a semi-conductor body. When a pit has been etched in a wafer according to the invention the potentials between the device and the electrolyte may be reversed. A metal ion-bearing electrolyte such as an acid solution of indium sulfate is substituted for the etchant. This may be conveniently accomplished by a switching valve as shown in FIGURE 1. When the valve rotor 72 is in the position shown in the figure, etching solution may be pumped through the valve to the nozzle. When the rotor is turned 90° in a clockwise direction, the flow of etching solution is cut off, and plating solution may be pumped to the nozzle. For plating, the wafer and the electrolyte are maintained at ground potential and a negative potential approximately equal to the biasing potential, is applied to the electrode. The metal ions are deposited preferentially upon the surface at the bottom of the pit that has been etched substantially parallel to the barrier since the depletion layer contacts this surface and lowers its potential. Only a negligible amount of plating is deposited upon the side walls of the pit since they are substantially at the same potential as the electrolyte. A device produced by this method is shown in FIGURE 3.

Figure 3:
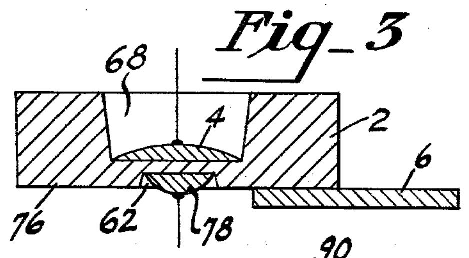

The device shown in FIGURE 3 is a transistor especially suitable for operation at relatively high frequencies. It comprises a base wafer 2 of n-type semi-conductive germanium about .020″ thick and about ⅛″ square. A pit or well 68 about .020″ in diameter is drilled in one side of the wafer by mechanical means. An indium collector electrode 4 is bonded to the wafer at the base of the pit forming a barrier in the wafer. The opposite surface of the wafer is then etched according to the invention to produce an etched pit 62 opposite the collector electrode and an indium emitter electrode 78 is electroplated as heretofore described at the base of the etched pit. The device may be conventionally etched, mounted and potted.

Figure 4:
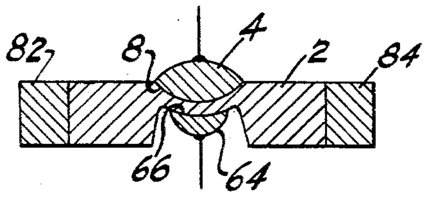

The method heretofore described may be modified to produce any of a large number of improved semi-conductor devices. For example, FIGURE 4 shows a unipolar transistor device consisting of a rectangular wafer 2 of n-type semi-conductive germanium or silicon having an ohmic contact 82 and 84 at each end and a pair of rectifying electrodes 4 and 64 extending substantially completely across opposite surfaces of the wafer. One barrier 8 may be formed first by alloying a length of an impurity material wire to one surface of the wafer to form a rectifying electrode extending completely across the surface. The surface for the second electrode may be prepared by etching according to the invention. A mask is provided defining a slot to expose a rectangular area extending substantially completely across the surface to be etched. The etching jet may be manipulated to traverse the length of the slot during the process but, preferably, the jet is enlarged or shaped into a fan so as to etch continuously the entire surface exposed by the mask. The extent of the etching is controlled in a manner exactly similar to that heretofore described to provide a region of controlled thickness between the initially established barrier and the etched surface. A wire 64 of a selected impurity material such as indium is laid at the bottom of the etched depression or slot and bonded thereto to form the second barrier 66. Alternatively, the second electrode may be electroplated as heretofore described. The operation of the device as a unipolar transistor is described in an article by Dacey and Ross in The Proceedings of the I.R.E. for August 1953, page 970.

Most practicable previous point contact transistors comprise two point contact probes placed adjacent to each other upon one surface of a semi-conductor wafer. The frequency response of such devices is limited by the minimum spacing obtainable between the points. It is difficult to place the two point probes close together without letting them make direct electrical contact with each other. Relatively closer spacing of two point contact probes may be realized in a transistor if the probes are not placed together upon the same surface of the wafer but are coaxially aligned upon opposite surfaces of a thin wafer. Improved results have not been previously accomplished by this method, however, principally because of the difficulty of providing a sufficiently thin wafer or a wafer having a sufficiently thin region.

Figure 5:
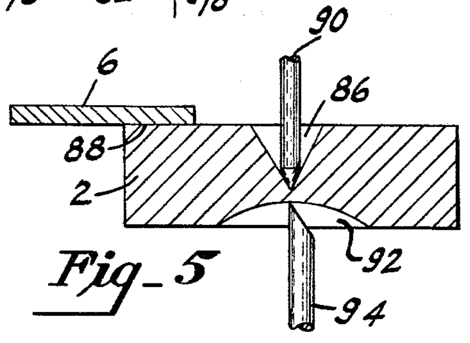

According to the present invention such a region of any desired thickness may be provided in a semi-conductor body. FIGURE 5 shows one constructional arrangement according to the invention for a point contact transistor suitable for operation at relatively high electrical frequencies. A conical pit or well is abrasive-blasted or mechanically drilled into a relatively thick semiconductor wafer 2. The wafer is etched to provide a clean, crystallographically undisturbed surface. A base connection 6 is made to the wafer by a substantially non-rectifying solder connection 88 and a sharpened point contact probe 90 is inserted in the well to contact the wafer at the base of the well. A barrier is thus provided adjacent to the contact point. Electrolytic etching according to the inveniton is utilized to etch a depression 92 into the opposite surface of the wafer to within a controlled distance of the base of the well. A second probe 94 is pressed upon the etched surface in alignment with the first probe to complete the device which may then be mounted, potted and, if desired, formed by electrical pulsing according to conventional techniques. The spacing between the two probes may be readily and accurately controlled by electroetching according to the invention. Whereas previous practicable point contact transistors had minimum effective point spacings of about .001″, spacings as close as 1$\mu$ may be provided by the improved method of the invention. The physical strength of such devices is enhanced by the sharpness of the conical well and by the relative sharpness of the etched pit. Only a relatively small region of the wafer is reduced to the desired thickness and the mechanical strength of this region is improved by its relatively small size and its close proximity to the relatively thick portions of the wafer. The small size of the thin region is also advantageous electrically in that the electrical resistance between the barriers and the base connection is minimized.

The foregoing examples of specific devices and embodiments of the instant invention are illustrative only. The invention may be utilized to make other semi-conductor devices than those specifically described herein. The materials of the devices and the geometrical arrangements of their parts are not to be considered as limiting the instant invention.

The practice of the invention is not limited to the particular control circuit and other apparatus illustrated and described. Etching according to the invention may be controlled by utilizing any circuit that provides means for applying a varying potential in the back direction across the barrier of a device being etched and means for measuring the instantaneous currents induced through the barrier by the applied potential. Means for applying a biasing potential are required if it is desired to broaden the critical etched surface, but these means need not be cooperatively arranged with the means for measuring the etching process.

A jet is utilized in the embodiment of the invention heretofore described simultaneously to contact an electrolyte to the etched surface and to flush away the etch reaction products which may otherwise form a gelatinous mass on the surface and impede the process. The shape and size of the etched pit are not dependent upon the jet but are determined by the mask. The invention is not limited, therefore, to the use of a jet but other means of simultaneously accomplishing these two functions may be alternatively utilized. For example, the device may be masked with a lacquer or other inert material and immersed in a vessel filled with the electrolyte. Agitation may be provided by any known means such as circulating the electrolyte at a relatively rapid rate or pumping air through the electrolyte to flush away the etch products from the surface. In etching materials which yield only soluble etch products, of course, it is not necessary to provide a flushing type of agitation.

One important feature of the invention is the measurement of the effective electrical thickness of the base region of a semi-conductor device, i.e., the region in a semi-conductor body between a barrier in the body and a surface being electrolytically etched. As explained heretofore, this measurement depends upon the bombardment of said surface by light or other radiant energy. The light creates charge carriers at the surface which effect a relatively sudden increase of current through the barrier when the edge of the depletion layer is made to approach the surface. The thickness of the base region is thus indicated by the value of the potential required to extend the depletion layer to the surface.

The acceleration of the etching rate as heretofore described and the control of the shape of the etched surface by the application of a forward bias across the barrier is described and claimed in the co-pending application of Jerome Kurshan, Serial No. 434,945, now abandoned, and a division thereof issued on February 27, 1962, as U.S. Patent 3,023,153, filed concurrently herewith. Satisfactory control of electrolytic etching may be accomplished without this feature. Improved results, however, are provided by accelerating the etching by applying an augmentive etching voltage across the barrier. The sharpness of the etched pit is improved and the rate of etching is accelerated.

Another feature of the invention is the accurate control of electroplating an electrode upon the surface of a semi-conductor body. According to this feature a potential is applied across a barrier in the body to extend the depletion layer to the surface of the body. Electroplating is controlled by the depletion layer effect so that material is deposited by the electrolyte only upon those portions of the wafer contacted by the depletion layer.

A further feature of the invention is the provision for a low electrolyzing voltage. The use of a relatively low electrolyzing voltage facilitates the accurate control of the thickness of the etched region. It permits a relatively rapid approach to the edge of the depletion layer and aids in preventing the etching from penetrating into the body beyond the edge of the depletion layer. If a relatively high electrolyzing potential is utilized, a correspondingly high biasing potential is required which may be in excess of the breakdown voltage of the barrier.

Electrodes of devices according to the invention are not limited to indium but may be made of any conductive material that is capable of forming a rectifying barrier in the semi-conductor body of the device. The electrode that is to be used as an emitter electrode when the device is incorporated in a circuit is preferably made of a material capable of injecting a large number of holes into the n-type semi-conductor. In the case of germanium and silicon examples of these materials are indium, tin and platinum. The material of the electrode to be utilized as a collector may be the same as the emitter or may be selected without regard to its hole injection ability.

Semi-conductive materials other than germanium and silicon may also be utilized in the practice of the invention. For example, n-type semi-conductive indium phosphide and aluminum antimonide are both suitable for use as base materials in semi-conductor devices. These and other semi-conductive materials may be electroetched according to the invention. The electrode materials, however, necessary for forming rectifying barriers and injecting holes into these semi-conductive materials may be different from the electrode materials that are particularly suitable for use with germanium or silicon. See, for example, the co-pending application of Dietrich A. Jenny, Serial No. 394,391, filed November 25, 1953, issued on December 24, 1957, as U.S. Patent 2,817,799. Said Jenny application discloses that the elements of column V*a* of the Periodic Table, namely, phosphorus, arsenic, antimony and bismuth are capable of forming p-n rectifying barriers in n-type semi-conductive cadmium telluride. These elements are regarded as suitable for forming p-n rectifying barriers in p-type semi-conductive germanium but not in n-type germanium.

There have thus been described new and improved semi-conductor devices and methods of making them including continuously controllable electrolytic etching of semi-conductor surfaces and electroplating of electrodes upon the etched surfaces.

What is claimed is:

1. In a method of electroetching a surface of a crystalline semi-conductive body having a rectifying barrier, said surface bounding a region of said body having n-type semi-conductivity, and said method including the steps of contacting an electrolyte to the portion of said surface to be etched, applying an electroetching potential between said electrolyte and an n-type region of said body to etch away a portion of said n-type region thereby to reduce the spacing between said surface and said barrier, the improvement comprising applying an alternating electrical potential across said barrier in the direction of its maximum resistance, the negative portion of the input cycle of said alternating potential thereby momentarily increasing the thickness of the depletion layer associated with said barrier to extend said layer toward said surface, said alternating potential having a peak value exceeding said electroetching potential, and illuminating said surface, said spacing between said surface and said barrier being indicated by the instantaneous value of said alternating potential at which the electric current induced thereby is abruptly increased by reason of said depletion layer's extension toward said surface.

2. In a method of electroetching a surface of a semi-conductor body having a rectifying barrier and a depletion layer associated with said barrier, said surface bounding a region of n-type conductivity in said body, said method including contacting an electrolyte to the portion of said n-type surface to be etched and inducing an electric current through said n-type region and said electrolyte by applying an electrical etching potential between said region and an electrode in contact with said electrolyte thereby to etch away a portion of said region to reduce the effective electrical spacing between said surface and said barrier, the improvement in measuring the penetration of said etching into said surface, comprising illuminating said surface to provide a relatively high concentration of electric charge carriers in said region at said surface, applying an alternating electrical potential across said barrier in the direction of its greatest resistance, said alternating potential having a peak value substantially exceeding said etching potential, the negative portion of the input cycle of said alternating potential thereby momentarily increasing the thickness of said depletion layer to advance it toward said surface, the instantaneous value of said alternating potential at which said depletion layer is sufficiently advanced to contact said concentration of charge carriers being equivalent to said spacing, said contact being indicated by a relatively abrupt increase in the electrical current induced through said barrier by said alternating potential as said alternating potential is varied through said instantaneous value.

3. In a method of electroetching a surface of a crystalline semi-conductive body, said body including a rectifying barrier and said method comprising contacting an electrolyte to the portion of said surface to be etched opposite said barrier and inducing an electric current through said body and said electrolyte by applying an electroetching potential therebetween in an etching direction thereby to reduce the spacing between said barrier and said surface, the improvement in controlling the reduction of said spacing comprising applying an alternating electrical potential in the back direction across said barrier during said electroetching, said alternating potential having a peak value exceeding said electroetching potential, and using the increase of the instantaneous electrical currents induced by said alternating potential as a function of said alternating potential to indicate when said reduction should be stopped.

4. In a method of electroetching a preselected surface of a body of semi-conductive germanium, said body including a rectifying barrier and a region of n-type conductivity bounded by said surface, said method comprising contacting an electrolyte to the portion of said n-type surface to be etched and inducing an electric current through said n-type conductivity region and said electrolyte by applying an electroetching potential therebetween in an etching direction thereby to reduce the spacing between said barrier and said surface, the improvement in controlling the reduction of said spacing comprising applying an alternating electrical potential in the back direction across said barrier during said electroetching, said alternating potential having a peak value exceeding said electroetching potential, and stopping said reduction when a predetermined increase in the instantaneous current induced by said alternating potential occurs at a predetermined instantaneous value of said alternating potential.

5. In a method of electroetching a depression into a surface of a crystalline semi-conductive body, said body including a rectifying barrier and said method comprising contacting an electrolyte to the portion of said surface to be etched opposite said barrier and inducing an electric current through said body and said electrolyte by applying an electroetching potential therebetween in an etching direction thereby to reduce the spacing between said barrier and said surface, the improvement in controlling the reduction of said spacing comprising applying an alternating electrical potential in the back direction across said barrier during said electroetching, said alternating potential having a peak value exceeding said electroetching potential, thereby to control the shape of said depression by accelerating said reduction of said spacing during the times said alternating potential is in a forward direction across said barrier, and stopping said reduction when a predetermined increase in the instantaneous current induced by said alternating potential when it is in a back direction across said barrier occurs at a predetermined instantaneous value of said alternating potential.

6. The invention according to claim 5 in which said stopping of said reduction is accomplished by applying a constant potential in the back direction across said barrier, said constant potential exceeding the electroetching potential.

7. In a method of electroetching a depression into a surface of a crystalline semi-conductive body, said body including a rectifying barrier and said method comprising contacting an electrolyte to the portion of said surface opposite said rectifying barrier to be etched and applying an electrolyzing potential between said body and an electrode in contact with said electrolyte thereby to induce an electric current through said body and said electrolyte in an etching direction to reduce the spacing between said barrier and said surface, the improvement in controlling the reduction of said spacing comprising applying an alternating electrical potential in the back direction across said barrier during said electroetching, said alternating potential having a peak value exceeding said electrolyzing potential, and, when a predetermined increase in the instantaneous current induced by said alternating potential occurs at a predetermined instantaneous value of said alternating potential, applying a constant potential in the back direction across said barrier thereby to stop said reduction.

8. In a method of electroetching a surface of a crystalline semi-conductive body, said body including a rectifying barrier and said method comprising contacting an electrolyte to the portion of said surface to be etched opposite said barrier and inducing an electrolyzing electric current through said body and said electrolyte by applying an electrolyzing potential therebetween in an etching direction thereby to reduce the spacing between said barrier and said surface, the improvement in controlling the reduction of said spacing comprising inducing said electric current by applying a potential difference of less than about 4 volts between said body and an electrode in contact with said electrolyte, applying an alternating electrical potential in the back direction across said barrier during said electroetching, said alternating potential having a peak value exceeding said electrolyzing potential, and, when a predetermined increase in the instantaneous current induced by said alternating potential occurs at a predetermined instantaneous value of said alternating potential, applying a constant potential in the back direction across said barrier thereby to stop said reduction, said constant potential being approximately equal to the sum of said electrolyzing potential and said predetermined instantaneous value of said alternating potential.

9. In a method of electroetching a surface of a crystalline semi-conductive body, said body including a rectifying barrier and said method comprising contacting an electrolyte to said surface opposite said barrier and inducing an electric current through said body and said electrolyte by applying an electrolyzing potential therebetween in an etching direction thereby to reduce the spacing between said barrier and said surface, the improvement in controlling the reduction of said spacing comprising masking said surface to expose only a selected portion thereof to said electrolyte, applying an alternating electrical potential in the back direction across said barrier during said electroetching, said alternating potential having a peak value exceeding said electrolyzing potential, and stopping said reduction when a predetermined increase in the instantaneous currents induced by said alternating potential occurs at a predetermined instantaneous value of said alternating potential.

10. A method of making a semi-conductor device comprising the steps of surface alloying a selected p-type impurity material upon a surface of an n-type semi-conductive body to form a first electrode bonded to said body and a rectifying barrier in said body adjacent to said electrode, contacting an electrolyte to a selected portion of a second surface of said body opposite said electrode, inducing an electric current through said body and said electrolyte by applying an electrolyzing potential therebetween in an etching direction thereby to etch a depression into said second surface to reduce the spacing between said second surface and said barrier, applying an alternating electrical potential in the back direction across said barrier during said electroetching, said alternating potential having a peak value exceeding said electrolyzing potential, stopping the penetration of said etching into said body toward said barrier when a predetermined increase in the instantaneous current induced by said alternating potential occurs at a predetermined instantaneous value of said alternating potential, and affixing a rectifying electrode upon the surface of said etched depression.

11. In a method of making a semi-conductor device including two spaced rectifying barriers disposed within a semi-conductor body, said method comprising affixing a first rectifying electrode to a first surface of an n-type semi-conductive body to form a first rectifying barrier within said body, the improvement in controlling the spacing between said two barriers comprising contacting an electrolyte to a selected portion of a second surface of said body opposite said rectifying electrode, inducing an electric etching current through said body and said electrolyte by applying an electrolyzing potential therebetween in an etching direction thereby to reduce the spacing between said first barrier and said second surface, applying an alternating electrical potential across said first barrier in its back direction while maintaining said etching current through said body and said electrolyte, said alternating potential having a peak value exceeding said electrolyzing potential, stopping said reduction when a predetermined increase in the instantaneous current induced by said alternating potential occurs at a predetermined instantaneous value of said alternating potential, and affixing a second electrode upon the surface exposed by said etching.

12. In a method of making a semi-conductor device including two spaced rectifying barriers disposed within a semi-conductor body, said method comprising contacting a first rectifying electrode to a first surface of an n-type semi-conductive body to form a first rectifying barrier within said body, the improvement in controlling the spacing between said two barriers comprising contacting an electrolyte to a selected portion of a second surface of said body opposite said first rectifying electrode, inducing an electric etching current through said body and said electrolyte by applying an electrolyzing potential therebetween in an etching direction thereby to reduce the spacing between said first barrier and said second surface, applying an alternating electrical potential across said first barrier in its back direction while maintaining said etching current through said body and said electrolyte, said alternating potential having a peak value exceeding said electrolyzing potential, stopping said reduction when a predetermined increase in the instantaneous current induced by said alternating potential occurs at a predetermined instantaneous value of said alternating potential, and contacting a second rectifying electrode upon the surface exposed by said etching.

13. In a method of making a semi-conductor device including two spaced rectifying barriers disposed within a semi-conductor body, said method comprising affixing a first rectifying electrode to a first surface of an n-type semi-conductive body to form a first rectifying barrier within said body, the improvement in controlling the spacing between said two barriers comprising contacting an electrolyte to a selected portion of a second surface of said body opposite said first rectifying electrode, inducing an electric etching current through said body and said electrolyte by applying an electrolyzing potential therebetween in an etching direction thereby to reduce the spacing between said first barrier and said second surface, applying an alternating electrical potential across said first barrier in its back direction while maintaining said etching current through said body and said electrolyte, said alternating potential having a peak value exceeding said electrolyzing potential, stopping said reduction when a predetermined increase in the instantaneous current induced by said alternating potential occurs at a predetermined instantaneous value of said alternating potential, contacting a metal ion-bearing electrolyte to said second surface, maintaining said body at a potential at least as positive as the potential of said metal ion-bearing electrolyte, and applying a potential in the back direction across said first barrier thereby to cause said metal ions to deposit upon a preselected area only of said second surface.

References Cited in the file of this patent

UNITED STATES PATENTS

| | | |
|---|---|---|
| 2,656,496 | Sparks | Oct. 20, 1953 |
| 2,694,040 | Davis | Nov. 9, 1954 |
| 2,746,918 | Whittington | May 22, 1956 |
| 2,846,346 | Bradley | Aug. 5, 1958 |
| 3,085,055 | Bradley | Apr. 9, 1963 |

OTHER REFERENCES

Bradley: "The Surface Barrier Transistor," Proceedings of the I.R.E., December 11, 1963, pages 1702–08 relied upon.

Proceedings of the I.R.E., December 1953 (vol. 41, No. 12), pages 1702 through 1708.